US012666644B2

(12) United States Patent
Jin

(10) Patent No.: US 12,666,644 B2
(45) Date of Patent: Jun. 23, 2026

(54) SEMICONDUCTOR STRUCTURE FACILITATING PREVENTION OF A PARASITIC DEVICE AND METHOD FOR FORMING SAME

(71) Applicants:Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 625 days.

(21) Appl. No.: 17/725,754

(22) Filed: Apr. 21, 2022

(65) Prior Publication Data

US 2023/0056668 A1     Feb. 23, 2023

(30) Foreign Application Priority Data

Aug. 23, 2021    (CN) ......................... 202110969140.X

(51) Int. Cl.
  *H10D 30/67*        (2025.01)
  *H10D 30/01*        (2025.01)
      (Continued)

(52) U.S. Cl.
  CPC ....... *H10D 30/6713* (2025.01); *H10D 30/031* (2025.01); *H10D 30/6735* (2025.01);
      (Continued)

(58) Field of Classification Search
  CPC ............. H10D 30/6713; H10D 30/031; H10D 30/6735; H10D 30/6739; H10D 30/6757;
      (Continued)

(56) References Cited

U.S. PATENT DOCUMENTS 9,035,365 B2 *   5/2015  Adam .................. H10D 64/679
                                                257/E21.409
10,497,624 B2 * 12/2019  Yu ........................ H10D 84/038
      (Continued)

*Primary Examiner* — Caleb E Henry
(74) *Attorney, Agent, or Firm* — Crowell & Moring LLP

(57)            ABSTRACT

A semiconductor structure and a method for forming the same are provided. One form of a method includes: forming a source/drain groove in the channel structure on two sides of a gate structure; forming a sacrificial epitaxial layer on a bottom of the source/drain groove; forming, on the sacrificial epitaxial layer, a source/drain doped layer in the source/drain groove; and removing the sacrificial epitaxial layer, to form a gap between a bottom of the source/drain doped layer and the protrusion. After the sacrificial epitaxial layer is formed, the source/drain doped layer located in the source/drain groove may be formed on the sacrificial epitaxial layer using the epitaxy process on the basis of the sacrificial epitaxial layer. Therefore, the epitaxy process for forming the source/drain doped layer is prevented from adverse effects, the epitaxial growth quality of the source/drain doped layer is ensured, and a performance of the semiconductor structure is optimized.

10 Claims, 7 Drawing Sheets

(51) Int. Cl.
    *H10D 62/10*         (2025.01)
    *H10D 64/01*         (2025.01)

(52) U.S. Cl.
    CPC ..... *H10D 30/6739* (2025.01); *H10D 30/6757*
        (2025.01); *H10D 62/118* (2025.01); *H10D*
            *64/017* (2025.01)

(58) Field of Classification Search
    CPC .. H10D 62/118; H10D 64/017; H10D 30/014;
        H10D 30/024; H10D 30/43; H10D 30/62;
            H10D 30/797; H10D 62/364; H10D
          62/822; H10D 62/121; H10D 62/151;
              H10D 62/116; B82Y 10/00
    See application file for complete search history.

(56)            References Cited

U.S. PATENT DOCUMENTS

| | | | |
|---|---|---|---|
| 2014/0327054 A1* | 11/2014 | Adam | H01L 21/283 |
| | | | 438/300 |
| 2015/0221884 A1* | 8/2015 | Han | H10K 10/484 |
| | | | 257/29 |
| 2017/0154958 A1* | 6/2017 | Fung | H10D 30/6735 |
| 2019/0103317 A1* | 4/2019 | Yu | H10D 84/0158 |
| 2020/0286992 A1* | 9/2020 | Song | H10D 62/151 |
| 2020/0411532 A1* | 12/2020 | Zhou | H10D 84/0158 |
| 2022/0216337 A1* | 7/2022 | Liang | H10D 62/021 |
| 2022/0328642 A1* | 10/2022 | Jin | H10D 30/6735 |
| 2022/0367701 A1* | 11/2022 | Wang | H10D 30/62 |
| 2023/0369328 A1* | 11/2023 | Su | H10D 64/017 |

* cited by examiner

SEMICONDUCTOR STRUCTURE FACILITATING PREVENTION OF A PARASITIC DEVICE AND METHOD FOR FORMING SAME

RELATED APPLICATIONS

The present application claims priority to Chinese Patent Appln. No. 202110969140.X, filed Aug. 23, 2021, the entire disclosure of each of which are hereby incorporated by reference.

TECHNICAL FIELD

Embodiments and implementations of the present disclosure relate to the field of semiconductor manufacturing, and in particular, to a semiconductor structure and a method for forming the same.

BACKGROUND

With the rapid development of semiconductor manufacturing technologies, semiconductor devices are developing toward higher element density and higher integration, and a developing trend of semiconductor process nodes according to the Moore's Law is continuously weakening. Transistors are currently being widely used as the most basic semiconductor devices. Therefore, as the element density and integration of the semiconductor devices increase, channel lengths of the transistors need to be continuously shortened to adapt to reduced process nodes.

In order to satisfy proportional reduction of a device size more effectively, the semiconductor process gradually transitions from a planar transistor to a three-dimensional transistor with higher efficacy, such as a fin field effect transistor (FinFET) and a gate-all-around (GAA) transistor. In the FinFET, the gate surrounds a fin channel from three sides. In the GAA transistor, the gate surrounds the area of the channel from all sides. Compared to the planar transistor, the gates of the FinFET and the GAA transistor have a stronger channel control capability and can suppress a short-channel effect more effectively.

However, the performance of current semiconductor structures still requires improvement.

SUMMARY

A problem to be addressed in embodiments and implementations of the present disclosure is to provide a semiconductor structure and a method for forming same. By means of the semiconductor structure and the method for forming same, the leakage current of the semiconductor structure is reduced, and the performance of the semiconductor structure is optimized.

To address the problem, one form of the present disclosure provides a semiconductor structure. A form of a semiconductor structure may include: a base, including a substrate and a plurality of protruding structures separately disposed on the substrate, where each protruding structure includes a protrusion and a channel structure located on the protrusion; an isolation layer, located on the substrate and surrounding the protrusion, where a top surface of the isolation layer is lower than a top surface of the protruding structures; a device gate structure, located on the isolation layer and spanning the channel structure; and source/drain doped layers, located in the channel structure on two sides of the device gate structure, where a gap is formed between a bottom of each source/drain doped layer and the protrusion.

In some implementations, the semiconductor structure further includes: an interlayer dielectric layer, located on the isolation layer exposed from the device gate structure, where the interlayer dielectric layer covers the source/drain doped layer, and fills a part or an entirety of the gap.

In some implementations, the isolation layer includes a first isolation layer located below the device gate structure and a second isolation layer located at a side of the device gate structure, and a top surface of the second isolation layer is lower than a top surface of the first isolation layer.

In some implementations, the source/drain doped layer includes a sidewall epitaxial layer, in contact with a sidewall of the channel structure below the device gate structure and a source/drain epitaxial layer, located on a sidewall of the sidewall epitaxial layer.

In some implementations, a material of the sidewall epitaxial layer includes at least one of silicon, silicon phosphide, silicon germanium, silicon carbide, germanium, gallium nitride, gallium arsenide, or indium gallium.

In some implementations, in a direction perpendicular to a bottom wall of the source/drain doped layer, a height of the gap is in a range of 5 nm to 10 nm.

In some implementations, a material of the substrate includes at least one of monocrystalline silicon, germanium, silicon germanium, silicon carbide, gallium nitride, gallium arsenide, or indium gallium; a material of the protrusion includes at least one of monocrystalline silicon, germanium, silicon germanium, silicon carbide, gallium nitride, gallium arsenide, or indium gallium; and a material of the channel structure includes at least one of monocrystalline silicon, germanium, silicon germanium, silicon carbide, gallium nitride, gallium arsenide, or indium gallium.

In some implementations, the protruding structure is a fin, and the protrusion and the channel structure are an integral structure; or the channel structure includes one or more channel layers spaced apart and suspended on the protrusion, and the device gate structure surrounds the channel layers.

In some implementations, the device gate structure includes a gate dielectric layer and a gate layer located on the gate dielectric layer.

In some implementations, a material of the gate dielectric layer includes at least one of silicon oxide, nitrogen-doped silicon oxide, $HfO_2$, $ZrO_2$, HfSiO, HfSiON, HfTaO, HfTiO, HfZrO, $La_2O_3$, or $Al_2O_3$; and a material of the gate layer includes at least one of TiN, TaN, Ti, Ta, TiAL, TiALC, TiSiN, W, Co, Al, Cu, Ag, Au, Pt, or Ni.

Another form of the present disclosure provides a method for forming a semiconductor structure, including: providing a base, where the base includes a substrate and a plurality of protruding structures separately disposed on the substrate, where each protruding structure includes a protrusion and a channel structure located on the protrusion, and forming, on the substrate, an isolation layer surrounding the protrusion, where a top surface of the isolation layer is lower than a top surface of the protruding structure; forming, on the isolation layer, a gate structure spanning the channel structure; forming source/drain grooves in the channel structure on two sides of the gate structure; forming a sacrificial epitaxial layer on a bottom of each source/drain groove; forming, on the sacrificial epitaxial layer, a source/drain doped layer in the source/drain groove; and removing the sacrificial epitaxial layer, to form a gap between a bottom of the source/drain doped layer and the protrusion.

In some implementations, the method for forming a semiconductor structure further includes: after the sacrificial epitaxial layer is removed, forming an interlayer dielectric layer on the isolation layer exposed from the gate structure, where the interlayer dielectric layer covers the source/drain doped layer and fills a part or an entirety of the gap.

In some implementations, in the step of forming the source/drain doped layer, the source/drain doped layer covers an exposed surface of the sacrificial epitaxial layer; and the step of removing the sacrificial epitaxial layer includes: after the source/drain doped layer is formed, removing, in thickness, a part of the isolation layer exposed from the gate structure, to expose a part of a sidewall of the sacrificial epitaxial layer; and removing the sacrificial epitaxial layer by using the exposed sidewall of the sacrificial epitaxial layer.

In some implementations, in the step of forming the source/drain groove, a bottom surface of the source/drain groove is lower than a bottom surface of the isolation layer.

In some implementations, in the step of forming the sacrificial epitaxial layer, a top surface of the sacrificial epitaxial layer is flush with or lower than a top surface of the isolation layer.

In some implementations, the sacrificial epitaxial layer is formed by using an epitaxy process.

In some implementations, the method for forming a semiconductor structure further includes: in the step of forming the sacrificial epitaxial layer, forming a sidewall epitaxial layer on the channel structure exposed from a sidewall of the source/drain groove by using the epitaxy process, where the sidewall epitaxial layer and the sacrificial epitaxial layer are an integral structure; and the step of forming the source/drain doped layer includes: forming a source/drain epitaxial layer on the sidewall epitaxial layer and the sacrificial epitaxial layer, where the source/drain epitaxial layer and the sidewall epitaxial layer are configured to form the source/drain doped layer.

In some implementations, the sacrificial epitaxial layer has an etching selectivity to both of the protrusion and the source/drain doped layer, and a material of the sacrificial epitaxial layer includes one or more of silicon, silicon phosphide, silicon germanium, silicon carbide, germanium, gallium nitride, gallium arsenide, and indium gallium.

In some implementations, in the step of forming the sacrificial epitaxial layer, a thickness of the sacrificial epitaxial layer is in a range of 5 nm to 10 nm.

In some implementations, in the step of providing the base, the protruding structure is a fin, or the channel structure includes one or more channel layers spaced apart and suspended on the protrusion, and a place holding portion is formed between the channel layer and the protrusion and between adjacent channel layers.

In some implementations, in the step of forming the gate structure, the gate structure is a dummy gate structure; the protruding structure is a fin, and the method for forming a semiconductor structure further includes: after the source/drain doped layer is formed, removing the dummy gate structure to form a gate opening, and forming a device gate structure in the gate opening; or the channel structure includes one or more channel layers spaced apart and suspended on the protrusion, and a place holding portion is formed between the channel layer and the protrusion and between adjacent channel layers. The method for forming a semiconductor structure further includes: after the source/drain doped layer is formed, removing the dummy gate structure to form a gate opening; removing the place holding portion through the gate opening, and forming a through groove between the protrusion and the channel layer or between the adjacent channel layers, where the through groove communicates with the channel layer; and forming a device gate structure in the gate opening and the through groove, where the device gate structure surrounds the channel layer.

Compared with the prior art, the technical solutions of embodiments and implementations of the present disclosure have at least the following advantages:

According to forms of a semiconductor structure provided in the present disclosure, a gap is formed between the bottom of the source/drain doped layer and the protrusion. By means of the gap, the isolation between the source/drain doped layer and the protrusion below the source/drain doped layer is achieved, facilitating prevention of a parasitic device in the protrusion below the source/drain doped layer. In this way, the leakage current of the semiconductor structure is reduced, and the performance of the semiconductor structure is optimized.

According to forms of a method for forming a semiconductor structure provided in the present disclosure, after the source/drain groove is formed and before the source/drain doped layer is formed in the source/drain groove, a sacrificial epitaxial layer is further formed at the bottom of the source/drain groove. Correspondingly, in the step of forming the source/drain doped layer, the source/drain doped layer is located on the sacrificial epitaxial layer. Moreover, after the source/drain doped layer is formed, the sacrificial epitaxial layer is removed, to form a gap between the bottom of the source/drain doped layer and the protrusion. By means of the gap, the isolation between the source/drain doped layer and the protrusion below the source/drain doped layer is achieved, facilitating prevention of a parasitic device in the protrusion below the source/drain doped layer. In this way, the leakage current of the semiconductor structure is reduced. Moreover, the source/drain doped layer is usually formed by using an epitaxy process, and the sacrificial epitaxial layer is made of an epitaxial layer material. After the sacrificial epitaxial layer is formed at the bottom of the source/drain groove, the source/drain doped layer located in the source/drain groove may be formed on the sacrificial epitaxial layer by using the epitaxy process on the basis of the sacrificial epitaxial layer. Therefore, the epitaxy process for forming the source/drain doped layer is prevented from adverse effects, the epitaxial growth quality of the source/drain doped layer is ensured, and the performance of the semiconductor structure is optimized.

DETAILED DESCRIPTION

As discussed in the background, the performance of current semiconductor structures requires improvement. Reasons why the performance of current semiconductor structures still requires improvement are analyzed below with reference to the drawings.

Specifically, a GAA transistor is used as an example. The GAA usually includes: a base, including a substrate and a plurality of protrusions separately disposed on the substrate; a channel structure layer, located on each protrusion and spaced apart from the protrusion and including one or more spaced channel layers; a gate structure, spanning the channel structure layer, located between adjacent channel layers or between the protrusion and a channel layer adjacent to the protrusion, and surrounding the channel layer; and source/drain doped layers, located on two sides of the gate structure and covering a sidewall of the channel structure layer.

Each source/drain doped layer is located on the protrusion and is in contact with the protrusion. Therefore, parasitic devices are formed in the protrusion below the channel structure layer, causing a leakage current in the protrusion below the channel structure layer. In particular, when the source/drain doped layer is embedded in the protrusion, a protruding structure is formed between the source/drain doped layers located on the two sides of the gate structure, and parasitic channels are formed in the protruding structure, resulting in more leakage currents of the device. As the source/drain doped layers is embedded in the protrusion more deeply, more leakage currents of the device are caused.

Currently, there are two methods for reducing the leakage currents of the semiconductor structure.

Figures 1, 2, 3:
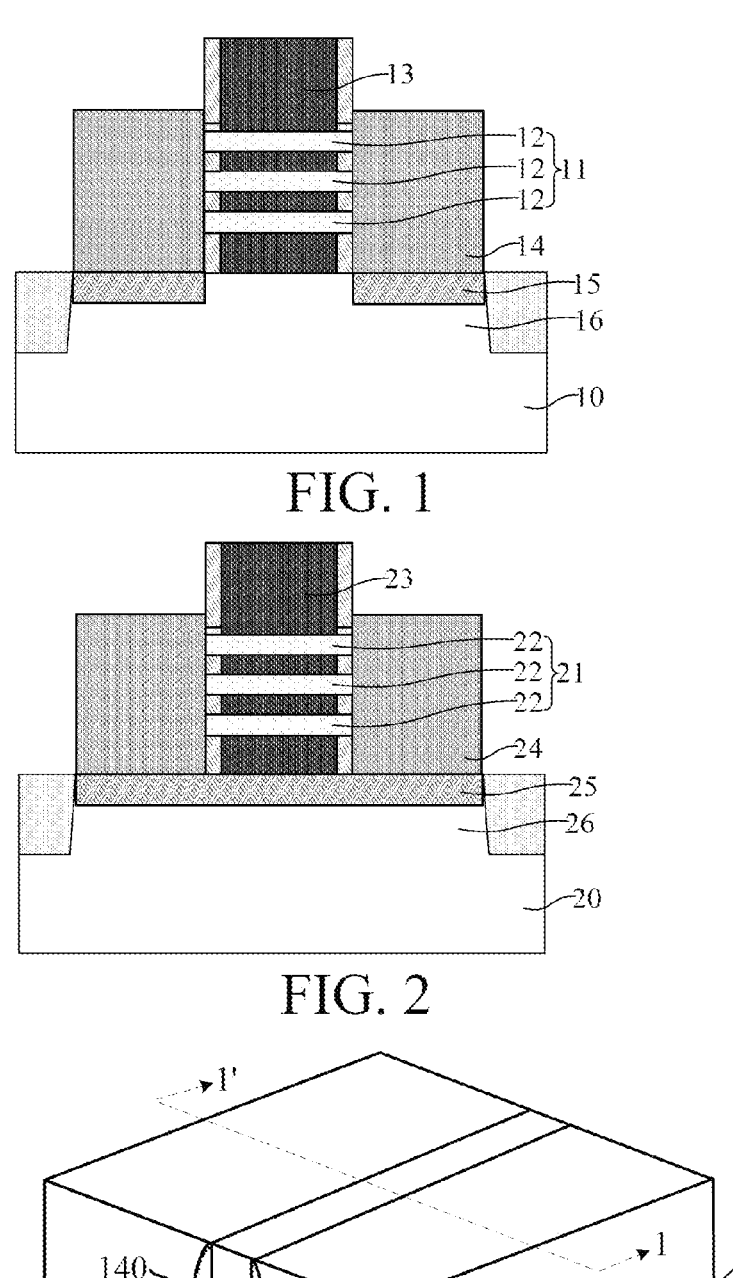
FIG. 1 is a schematic structural diagram of a semiconductor structure.
FIG. 2 is a schematic structural diagram of another semiconductor structure.
FIG. 3 and FIG. 4 are schematic structural diagrams of one form of a semiconductor structure according to the present disclosure.

FIG. 1 is a schematic structural diagram of a semiconductor structure. The semiconductor structure includes: a base 10, where a plurality of protrusions 16 are separately disposed on the substrate 10; a channel structure layer 11, located on each protrusion 16 and spaced apart from the protrusion 16 and including one or more spaced channel layers 12; a gate structure 13, spanning the channel structure layer 11, located between adjacent channel layers 12 or between each protrusion 16 and a channel layer 12 adjacent to the protrusion 16, and surrounding the channel layer 12; and source/drain doped layers 14, located on two sides of the gate structure 13 and covering a sidewall of the channel structure layer 11; and an isolation layer 15, located between the protrusion 16 and the source/drain doped layers 14.

In the semiconductor structure, the isolation layer 15 is disposed between the source/drain doped layers 14 and the protrusion 16 to isolate the source/drain doped layers 14 from the protrusion 16. Therefore, the source/drain doped layers 14 cannot come into contact with the protrusion 16, thereby reducing the leakage currents generated in the protrusion 16 below the channel structure layer 11.

However, the source/drain doped layers 14 are usually formed by using an epitaxy process. Disposing the isolation layer 15 between bottoms of the source/drain doped layers 14 and the protrusion 16 greatly affects the epitaxy process of forming the source/drain doped layers 14, resulting in undesirable quality of the source/drain doped layers 14 and poor performance of the semiconductor structure.

FIG. 2 is a schematic structural diagram of another semiconductor structure. The semiconductor structure includes: a base 20, where a plurality of protrusions 26 are separately disposed on the substrate 20; an isolation layer 25, located on each protrusion 26; a channel structure layer 21, located on the isolation layer 25 and spaced apart from the isolation layer 25 and including one or more spaced channel layers 22; a gate structure 23, spanning the channel structure layer 21, located between adjacent channel layers 22 or between the isolation layer 25 and a channel layer 22 adjacent to the isolation layer 25, and surrounding the channel layer 22; and source/drain doped layers 24, located on the isolation layer 25 on two sides of the gate structure 23 and covering a sidewall of the channel structure layer 21.

In the semiconductor structure, the isolation layer 25 is disposed below the channel structure layer 21, the gate structure 23, and the source/drain doped layers 24. By means of the isolation layer 25, the entire device is isolated from the protrusions 26, and the leakage currents generated in the protrusions 26 are correspondingly reduced.

Disposing the isolation layer 25 between bottoms of the source/drain doped layers 24 and the protrusions 26 in the semiconductor structure greatly affects the epitaxy process of forming the source/drain doped layers 24, resulting in undesirable quality of the source/drain doped layers 24 and poor performance of the semiconductor structure. Moreover, no specific method for forming the isolation layer 25 has been disclosed.

In a FinFET, an isolation layer is disposed at a bottom of a source/drain doped layer below the source/drain doped layer and an active fin. Therefore, the problem remains.

To address the technical problems, one form of the present disclosure provides a semiconductor structure. Some implementations of a semiconductor structure includes: a base, including a substrate and a plurality of protruding structures separately disposed on the substrate, where each protruding structure includes a protrusion and a channel structure located on the protrusion; an isolation layer, located on the substrate and surrounding the protrusion, where a top surface of the isolation layer is lower than a top surface of the protruding structure; a device gate structure, located on the isolation layer and spanning the channel structure; and source/drain doped layers, located in the channel structure on two sides of the device gate structure, where a gap is formed between a bottom of each source/drain doped layer and the protrusion.

In some implementations of a semiconductor structure, a gap is formed between the bottom of the source/drain doped layer and the protrusion. By means of the gap, the isolation between the source/drain doped layer and the protrusion below the source/drain doped layer is achieved, facilitating prevention of a parasitic device in the protrusion below the source/drain doped layer. In this way, the leakage current of the semiconductor structure is reduced, and the performance of the semiconductor structure is optimized.

To address the technical problems, another form of the present disclosure further provide a method for forming a semiconductor structure. In some implementations, a method includes: providing a base, where the base includes a substrate and a plurality of protruding structures separately disposed on the substrate, and each protruding structure includes a protrusion and a channel structure located on the protrusion, and forming, on the substrate, an isolation layer surrounding the protrusion, where a top surface of the isolation layer is lower than a top surface of the protruding structure; forming, on the isolation layer, a gate structure spanning the channel structure; forming source/drain grooves in the channel structure on two sides of the gate structure; forming a sacrificial epitaxial layer on a bottom of each source/drain groove; forming, on the sacrificial epitaxial layer, a source/drain doped layer in the source/drain groove; and removing the sacrificial epitaxial layer, to form a gap between a bottom of the source/drain doped layer and the protrusion.

In some implementations of a method for forming a semiconductor structure, after the source/drain groove is formed and before the source/drain doped layer is formed in the source/drain groove, a sacrificial epitaxial layer is further formed at the bottom of the source/drain groove. Correspondingly, in the step of forming the source/drain doped layer, the source/drain doped layer is located on the sacrificial epitaxial layer. Moreover, after the source/drain doped layer is formed, the sacrificial epitaxial layer is removed, to form a gap between the bottom of the source/drain doped layer and the protrusion. By means of the gap, the isolation between the source/drain doped layer and the protrusion below the source/drain doped layer is achieved, facilitating prevention of a parasitic device in the protrusion below the source/drain doped layer. In this way, the leakage current of the semiconductor structure is reduced. Moreover, the source/drain doped layer is usually formed by using an epitaxy process, and the sacrificial epitaxial layer is made of an epitaxial layer material. After the sacrificial epitaxial layer is formed at the bottom of the source/drain groove, the source/drain doped layer located in the source/drain groove may be formed on the sacrificial epitaxial layer by using the epitaxy process on the basis of the sacrificial epitaxial layer. Therefore, the epitaxy process for forming the source/drain doped layer is prevented from adverse effects, the epitaxial growth quality of the source/drain doped layer is ensured, and the performance of the semiconductor structure is optimized.

Figures 4, 5, 6:
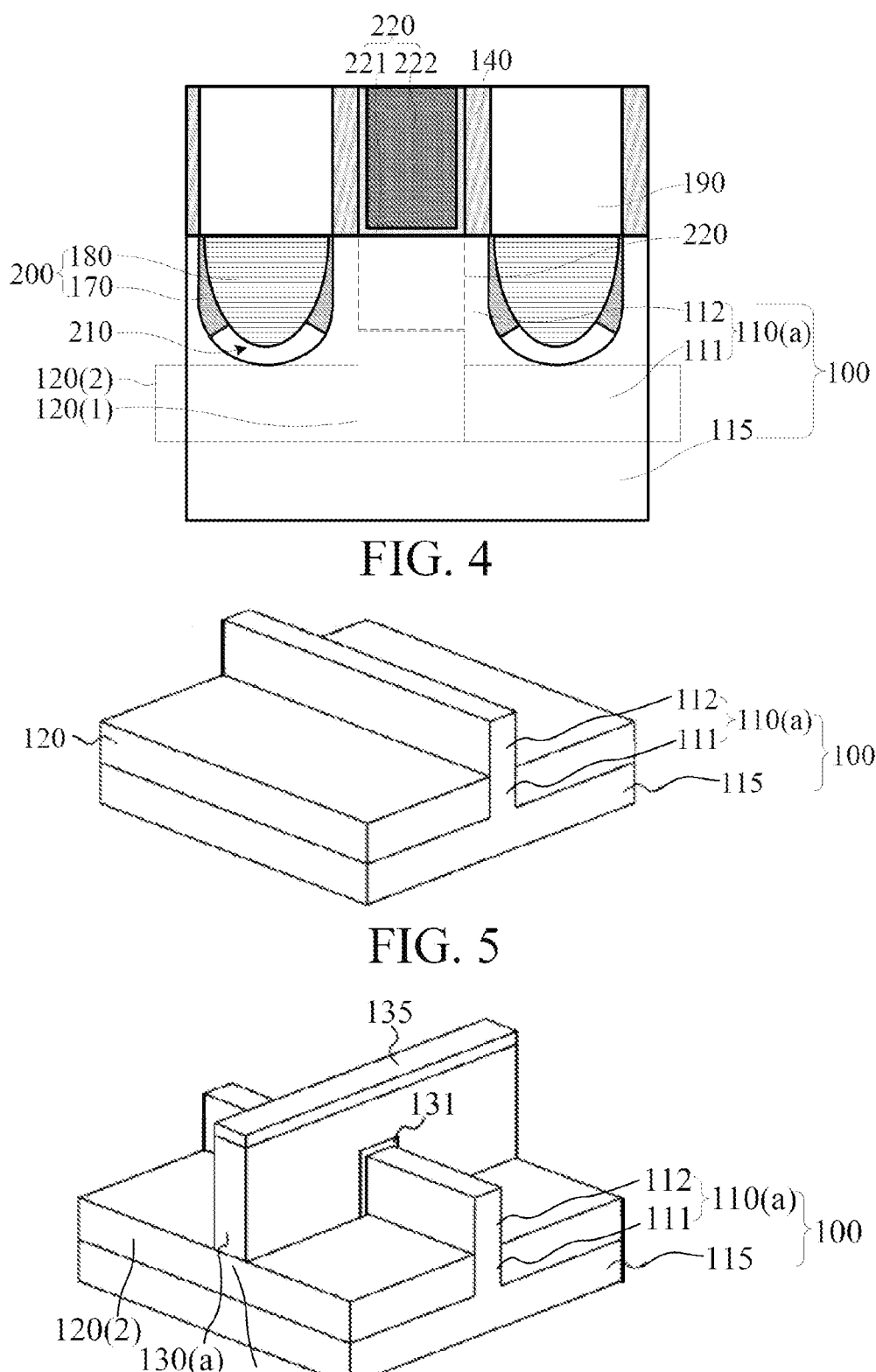
FIG. 5 to FIG. 19 are schematic structural diagrams corresponding to steps in one form of a method for forming a semiconductor structure according to the present disclosure.

To make the foregoing objectives, features, and advantages of embodiments and implementations of the present disclosure more apparent and easier to understand, specific embodiments and implementations of the present disclosure are described in detail below with reference to the accompanying drawings. FIG. 3 to FIG. 4 are schematic structural diagrams of one form of a semiconductor structure according to the present disclosure. FIG. 3 is a three-dimensional schematic structural diagram, and FIG. 4 is a cross-sectional view of FIG. 3 in a direction 1-1'.

In this form, the semiconductor structure includes: a base 100, including a substrate 115 and a plurality of protruding structures 110 separately disposed on the substrate 115, where each protruding structure 110 includes a protrusion 111 and a channel structure 112 located on the protrusion 111; an isolation layer 120, located on the substrate 115 and surrounding the protrusion 111, where a top surface of the isolation layer 120 is lower than a top surface of the protruding structure 110; a device gate structure 220, located on the isolation layer 120 and spanning the channel structure 112; and source/drain doped layers 200, located in the channel structure 112 on two sides of the device gate structure 220, where a gap 210 is formed between a bottom of each source/drain doped layer 200 and the protrusion 111.

The base 100 is configured to provide a process platform for forming the semiconductor structure.

In some implementations, the substrate 115 is a silicon substrate. That is to say, the substrate 115 is made of monocrystalline silicon. In other implementations, the substrate may be made of one or more of germanium, silicon germanium, silicon carbide, gallium nitride, gallium arsenide, and indium gallium. The substrate may also be other types of substrates such as a silicon substrate or a germanium substrate on an insulator.

The plurality of protruding structures 110 are separated on the substrate 115. The plurality of protruding structures 110 are arranged in parallel and spaced apart.

The protrusion 111 is configured to provide a process basis for forming the isolation layer 120. Therefore, the isolation layer 120 can surround the protrusion 111. In this way, adjacent protruding structures 110 can be isolated from each other, and the substrate 115 and the device gate structure 220 can also be isolated from each other.

In some implementations, the protrusion 111 is made of monocrystalline silicon. In other implementations, the protrusion may be made of one or more of germanium, silicon germanium, silicon carbide, gallium nitride, gallium arsenide, and indium gallium.

In some implementations, the protrusion 111 and the substrate 115 may be an integral structure. In other implementations, the protrusion may also be a semiconductor layer formed on the substrate. Correspondingly, the protrusion and the semiconductor layer are not an integral structure.

The channel structure 112 is configured to provide a conductive channel of an FET.

In some implementations, the channel structure 112 is made of monocrystalline silicon. In other implementations, the channel structure may be made of one or more of germanium, silicon germanium, silicon carbide, gallium nitride, gallium arsenide, and indium gallium.

In some implementations, a FinFET is to be formed, for example. The protruding structure 110 is a fin 110(a). The protrusion 111 and the channel structure 112 are correspondingly an integral structure. The protrusion 111 is used as a bottom of the fin, and the channel structure 112 is used as an active fin. During operation of the FET, a conductive channel is formed in the active fin.

In other implementations, when transistors of other structure types are to be formed, the protruding structure may also be of other structure types. For example, when a GAA transistor is to be formed, the channel structure includes one or more channel layers spaced apart and suspended on the protrusion. The channel layers are configured to provide a conductive channel of the GAA transistor.

The isolation layer 120 is configured to isolate adjacent protruding structures 110. More specifically, the isolation layer 120 is configured to isolate the adjacent protrusions 111 and isolate the substrate 115 from the device gate structure 220.

Specifically, the isolation layer 120 covers a sidewall of the protrusion 111 and exposes the channel structure 112.

In some implementations, the protruding structure 110 is a fin 110(a), and the fin 110(a) (that is, the channel structure 112) exposed from the isolation layer 120 is used as an active fin. The active fin is configured to provide a conductive channel of the FET.

In some implementations, the isolation layer 120 is a shallow trench isolation (STI) structure. In some implementations, the isolation layer 120 is made of silicon oxide. In other implementations, the isolation layer may be made of other insulating materials such as silicon nitride or silicon oxynitride.

For ease of illustration and description, in the cross-sectional view, a dashed-line box 120 is used to indicate a position and a thickness of the isolation layer 120 in a direction perpendicular to the substrate 115.

It should be noted that, in some implementations, the isolation layer 120 includes a first isolation layer 120(1) located below the gate structure 130 and a second isolation layer 120(2) located at a side of the gate structure 130. A top surface of the second isolation layer 120(2) is lower than a top surface of the first isolation layer 120(1).

The reasons why the top surface of the second isolation layer 120(2) is lower than the top surface of the first isolation layer 120(1) are as follows. During the formation of the semiconductor structure, a dummy gate structure for holding a place for the device gate structure 220 is formed on the isolation layer 120, a source/drain groove is formed in the channel structure 112, and a sacrificial epitaxial layer for holding a place for a gap 210 is further formed at the bottom of the source/drain groove, and then an epitaxy process is performed on the basis of the sacrificial epitaxial layer to form the source/drain doped layer 200. After the source/drain doped layer 200 is formed, a part of the isolation layer 120 exposed from the dummy gate structure is removed in thickness, to expose the sidewall of the sacrificial epitaxial layer. Therefore, the gap 210 may be formed by removing the sacrificial epitaxial layer by using the exposed sidewall of the sacrificial epitaxial layer.

Since the source/drain doped layer 200 is formed on the sacrificial epitaxial layer by using the epitaxy process on the basis of the sacrificial epitaxial layer, the epitaxy process for forming the source/drain doped layer 200 is prevented from adverse effects, the epitaxial growth quality of the source/drain doped layer 200 is ensured, and the performance of the semiconductor structure is optimized.

The device gate structure 220 is configured to control the conductive channel to open and close.

In some implementations, the semiconductor structure is a FinFET, and the device gate structure 220 spans the fin 110(a) and covers a part of a top and a part of a sidewall of the fin 110(a).

In other implementations, when the semiconductor structure is a GAA transistor, the channel structure includes one or more channel layers spaced apart and suspended on the protrusion. The device gate structure surrounds the channel layers.

The device gate structure 220 includes a gate dielectric layer 221 and a gate layer 222 located on the gate dielectric layer 221.

The gate dielectric layer 211 is configured to implement electrical isolation between the gate layer 222 and the channel.

A material of the gate dielectric layer 211 includes one or more of silicon oxide, nitrogen-doped silicon oxide, $HfO_2$, $ZrO_2$, HfSiO, HfSiON, HfTaO, HfTiO, HfZrO, $La_2O_3$, and $Al_2O_3$.

The gate layer 222 is used as an external electrode for electrically connecting the device gate structure 220 to an external circuit.

In some implementations, the device gate structure 220 is a metal gate structure. Correspondingly, the gate dielectric layer 211 includes a high-k gate dielectric layer, and the gate layer 222 is a metal gate layer.

In some implementations, a material of the gate layer 222 includes one or more of TiN, TaN, Ti, Ta, TiAL, TiALC, TiSiN, W, Co, Al, Cu, Ag, Au, Pt, and Ni.

In some implementations, for ease of illustration and description, a position of a bottom of the device gate structure 220 is indicated by a dashed-line box in the cross-sectional view.

In some implementations, the semiconductor structure further includes a gate spacer 140 located on a sidewall of the device gate structure 220.

The gate spacer 140 is configured to protect the sidewall of the device gate structure 220. The gate spacer 140 is further configured to define a position for forming the source/drain doped layer 200.

The gate spacer 140 may be made of one or more of silicon oxide, silicon nitride, silicon oxynitride, silicon carbide, silicon oxycarbide or silicon oxycarbonitride, boron nitride, and carbon boron nitride. The gate spacer 140 may be a single-layer structure or a laminated-layer structure. In some implementations, the gate spacer 140 is a single-layer structure, and the gate spacer 140 is made of silicon nitride.

The source/drain doped layer 200 is used as a source or a drain of the FET. During operation of the FET, the source/drain doped layer 200 is configured to provide a carrier source.

Moreover, a gap 210 is formed between the bottom of the source/drain doped layer 200 and the protrusion 111. By means of the gap 210, the isolation between the source/drain doped layer 200 and the protrusion 111 below the source/drain doped layer is achieved, facilitating prevention of a parasitic device in the protrusion 111 below the source/drain doped layer 200. In this way, the leakage current of the semiconductor structure is reduced, and the performance of the semiconductor structure is optimized.

During the formation of the semiconductor structure, the source/drain doped layer 200 is formed on the sacrificial epitaxial layer. After the sacrificial epitaxial layer is removed, a gap 210 may be formed between the bottom of the source/drain doped layer 200 and the protrusion 111 to provide a spacing between the bottom of the source/drain doped layer 200 and the protrusion 111.

The source/drain doped layer 200 is usually formed by using an epitaxy process, and the sacrificial epitaxial layer is made of an epitaxial layer material. During the formation of the source/drain doped layer 200, the source/drain doped layer 200 may be formed on the sacrificial epitaxial layer by using the epitaxy process on the basis of the sacrificial epitaxial layer. Therefore, the epitaxy process for forming the source/drain doped layer 200 is prevented from adverse effects, the epitaxial growth quality of the source/drain doped layer 200 is ensured, and the performance of the semiconductor structure is optimized.

Before the sacrificial epitaxial layer is formed, source/drain grooves are formed in the channel structure on the two sides of the dummy gate structure, and the step of forming the sacrificial epitaxial layer includes: forming epitaxial material layers on the channel structure 112 exposed from a sidewall and a bottom of each source/drain groove. The epitaxial material layer on the channel structure 112 exposed from the bottom of the source/drain groove is used as the sacrificial epitaxial layer, and the epitaxial material layer on the channel structure 112 exposed from the sidewall of the source/drain groove is used as a sidewall epitaxial layer.

After the source/drain doped layer 200 is formed, the sacrificial epitaxial layer is removed to form a gap 210, and the sidewall epitaxial layer is retained in the semiconductor structure to constitute the source/drain doped layer 200.

Therefore, in some implementations, the source/drain doped layer 200 includes a sidewall epitaxial layer 170, in contact with a sidewall of the channel structure 112 below the device gate structure 220; a source/drain epitaxial layer 180, located on a sidewall of the sidewall epitaxial layer 170.

The source/drain epitaxial layer 180 and the sidewall epitaxial layer 170 are configured to form the source/drain doped layer 200.

The source/drain epitaxial layer 180 covers the sidewall of the sidewall epitaxial layer 170. Therefore, the source/drain doped layer 200 is in contact with an end of the channel structure 112 that is in an extending direction.

The sidewall epitaxial layer 170 is made of a semiconductor material. That is to say, during the formation of the semiconductor structure, the sacrificial epitaxial layer is also made of a semiconductor material. Therefore, the sacrificial epitaxial layer can be used as a growth basis of the epitaxy process for forming the source/drain doped layer. Moreover, the sidewall epitaxial layer 170 can be retained as a part of the source/drain doped layer 200.

In some implementations, the material of the sidewall epitaxial layer 170 includes one or more of silicon, silicon phosphide, silicon germanium, silicon carbide, germanium, gallium nitride, gallium arsenide, and indium gallium.

For example, the protruding structure 110 is a fin 110(*a*), the fin 110(*a*) is made of silicon, and the sidewall epitaxial layer 170 is made of silicon germanium. Silicon germanium is a source/drain doped layer material frequently used in the semiconductor field, facilitating improvement of the process compatibility. Moreover, during the formation of the semiconductor structure, the sacrificial epitaxial layer is also made of silicon germanium. There is a relatively high etching selectivity between silicon germanium and silicon.

In some implementations, the sidewall epitaxial layer 170 is configured to form the source/drain doped layer 200. Therefore, the sidewall epitaxial layer 170 is further doped with ions. When an NMOS transistor is to be formed, the sidewall epitaxial layer 170 is doped with N-type ions. When a PMOS transistor is to be formed, the sidewall epitaxial layer 170 is doped with P-type ions.

In some implementations, the source/drain epitaxial layer 180 and the sidewall epitaxial layer 170 are configured to constitute a stress layer. Therefore, during operation of the FET, a stress can be provided to a channel region, thereby improving the carrier mobility.

Specifically, the source/drain epitaxial layer 180 is formed by using the epitaxy process on the growth basis of the sidewall epitaxial layer 170 and the sacrificial epitaxial layer, thereby ensuring the quality of the source/drain epitaxial layer 180.

In some implementations, the source/drain epitaxial layer 180 is doped with ions. When a PMOS transistor is to be formed, the source/drain epitaxial layer 180 is doped with P-type ions, and the source/drain epitaxial layer 180 is made of Si or SiGe. When a PMOS transistor is to be formed, the source/drain epitaxial layer 180 includes a stress layer doped with N-type ions, and the source/drain epitaxial layer 180 is made of Si or SiC.

The gap 210 is configured to isolate the source/drain doped layer 200 from the protrusion 111 below the source/drain doped layer, facilitating prevention of a parasitic device in the protrusion 111 below the source/drain doped layer 200, thereby reducing the leakage current of the device.

It should be noted that a height of the gap 210 is required to be neither excessively small nor excessively large. If the height of the gap 210 is excessively small, a distance between the bottom of the source/drain doped layer 200 and the protrusion 111 below the source/drain doped layer is also excessively small, degrading the leakage current reduction effect of the gap 210. If the height of the gap 210 is excessively large, a space for forming the source/drain doped layer 200 is occupied, reducing a volume of the source/drain doped layer 200.

In some implementations, a top surface of the gap 210 is flush with or lower than the top surface of the isolation layer 120. That is to say, the gap 210 is buried in the isolation layer 120. Therefore, a sufficient space is provided for forming the source/drain doped layer 200, ensuring that the volume of the source/drain doped layer 200 can meet the process requirements, thereby ensuring that the stress in the source/drain doped layer 200 meets the process requirements.

In other implementations, the top surface of the gap may be higher than the top surface of the isolation layer based on actual process requirements.

More specifically, for example, in a direction perpendicular to a bottom wall of the source/drain doped layer 200, a height of the gap 210 is in a range of 5 nm to 10 nm. For example, the height of the gap is 6 nm, 7 nm, 7.5 nm, 8 nm, or 9 nm.

In some implementations, the semiconductor structure further includes an interlayer dielectric layer 190, located on the isolation layer 120 exposed from the device gate structure 220. The interlayer dielectric layer 190 covers the source/drain doped layer 200.

The interlayer dielectric layer 190 fills a part or an entirety of the gap 210.

The interlayer dielectric layer 190 is configured to isolate adjacent devices from each other. In some implementations, the interlayer dielectric layer 190 is made of silicon oxide. The interlayer dielectric layer 190 may also be made of other insulating materials.

During specific implementation, the interlayer dielectric layer 190 may include an etching stop layer (not shown) conformally covering a sidewall of the gate spacer 135 and a surface of the source/drain doped layer 200 and a dielectric material layer (not shown) located on the etching stop layer. The etching stop layer or the dielectric material layer fills a part or an entirety of the gap 210.

The etching stop layer is configured to temporarily define an etching stop position in an etching process for forming a source/drain contact hole, to prevent the source/drain doped layer 200 from being damaged in the etching process for the source/drain contact hole.

For example, the etching stop layer is made of silicon nitride.

In some other implementations, the interlayer dielectric layer may not include the etching stop layer.

Accordingly, the present disclosure further provides a method for forming a semiconductor structure. FIG. 5 to FIG. 19 are schematic structural diagrams corresponding to steps in one form of a method for forming a semiconductor structure according to the present disclosure.

A method for forming a semiconductor structure is described in detail below with reference to the drawings.

With reference to FIG. 5, a base 100 is provided, where the base includes a substrate 115 and a plurality of protruding structures 110 separately disposed on the substrate 115, and each protruding structure 110 includes a protrusion 111 and a channel structure 112 located on the protrusion 111, and an isolation layer 120 surrounding the protrusion 111 is formed on the substrate 115, where a top surface of the isolation layer 120 is lower than a top surface of the protruding structure 110.

The base 100 is configured to provide a process platform for a subsequent manufacture procedure.

In some implementations, the substrate 115 is a silicon substrate. That is to say, the substrate 115 is made of monocrystalline silicon. In other implementations, the substrate may be made of one or more of germanium, silicon germanium, silicon carbide, gallium nitride, gallium arsenide, and indium gallium. The substrate may also be other types of substrates such as a silicon substrate or a germanium substrate on an insulator.

The plurality of protruding structures 110 are separated on the substrate 115. The plurality of protruding structures 110 are arranged in parallel and spaced apart.

The protrusion 111 is configured to provide a process basis for forming the isolation layer 120. Therefore, the isolation layer 120 can surround the protrusion 111. In this way, adjacent protruding structures 110 can be isolated from each other, and the substrate 115 and the gate structure can also be isolated from each other.

In some implementations, the protrusion 111 is made of monocrystalline silicon. In other implementations, the protrusion may be made of one or more of germanium, silicon germanium, silicon carbide, gallium nitride, gallium arsenide, and indium gallium.

In some implementations, the protrusion 111 and the substrate 115 may be an integral structure. In other implementations, the protrusion may also be a semiconductor layer formed on the substrate. Correspondingly, the protrusion and the semiconductor layer are not an integral structure.

The channel structure 112 is configured to provide a conductive channel of an FET.

In some implementations, the channel structure 112 is made of monocrystalline silicon. In other implementations, the channel structure 112 may be made of one or more of germanium, silicon germanium, silicon carbide, gallium nitride, gallium arsenide, and indium gallium.

In some implementations, a FinFET is to be formed, for example. The protruding structure 110 is a fin 110(*a*). The protrusion 111 and the channel structure 112 are correspondingly an integral structure. The protrusion 111 is used as a bottom of the fin, and the channel structure 112 is used as an active fin. During operation of the FET, a conductive channel is formed in the active fin.

In other implementations, when transistors of other structure types are to be formed, the protruding structure may also be of other structure types. For example, when a GAA transistor is to be formed, the channel structure includes one or more channel layers spaced apart and suspended on the protrusion, and a place holding portion is formed between the channel layer and the protrusion and between adjacent channel layers.

The channel layers are configured to provide a conductive channel of the GAA transistor. The place holding portion is configured to support the channel layer, to provide a process basis for subsequent spaced suspension of the channel layers. The place holding portion is further configured to occupy a space for subsequently forming the gate structure.

The isolation layer 120 is configured to isolate adjacent protruding structures 110. More specifically, the isolation layer 120 is configured to isolate the adjacent protrusions 111 and isolate the substrate 115 from the gate structure 130.

Specifically, the isolation layer 120 covers a sidewall of the protrusion 111 and exposes the channel structure 112.

In some implementations, the protruding structure 110 is a fin 110(*a*), and the fin 110(*a*) (that is, the channel structure 112) exposed from the isolation layer 120 is used as an active fin. The active fin is configured to provide a conductive channel of the FET.

In some implementations, the isolation layer 120 is a shallow trench isolation (STI) structure. In some implementations, the isolation layer 120 is made of silicon oxide. In other implementations, the isolation layer may be made of other insulating materials such as silicon nitride or silicon oxynitride.

With reference to FIG. 6, a gate structure 130 spanning the channel structure 112 is formed on the isolation layer 120.

The gate structure 130 is a dummy gate structure 130(*a*). The dummy gate structure 130(*a*) is configured to occupy a space for forming a device gate structure.

In some implementations, the gate structure 130 covers a part of a top and a part of a sidewall of the fin 110(*a*) exposed from the isolation layer 120.

In some implementations, the dummy gate structure 130 (*a*) includes a dummy gate layer. A material of the dummy gate layer includes polysilicon or amorphous silicon.

In some implementations, a dummy gate oxide layer 131 is further formed between the gate structure 130 and the protruding structure 110. The dummy gate oxide layer 131 is configured to isolate the protruding structure 110 from the gate structure 130, and stop the etching during subsequent removal of the gate structure 130, thereby reducing the probability of damage to the protruding structure 110.

The dummy gate oxide layer 131 is made of silicon oxide or nitrogen-doped silicon oxide.

In some implementations, a gate mask layer 135 is further formed on a top of the gate structure 130. The gate mask layer 135 is used as an etching mask for forming the gate structure 130, and is further configured to protect the top of the gate structure 130.

In some implementations, the gate mask layer 135 is made of silicon nitride.

Figure 7:
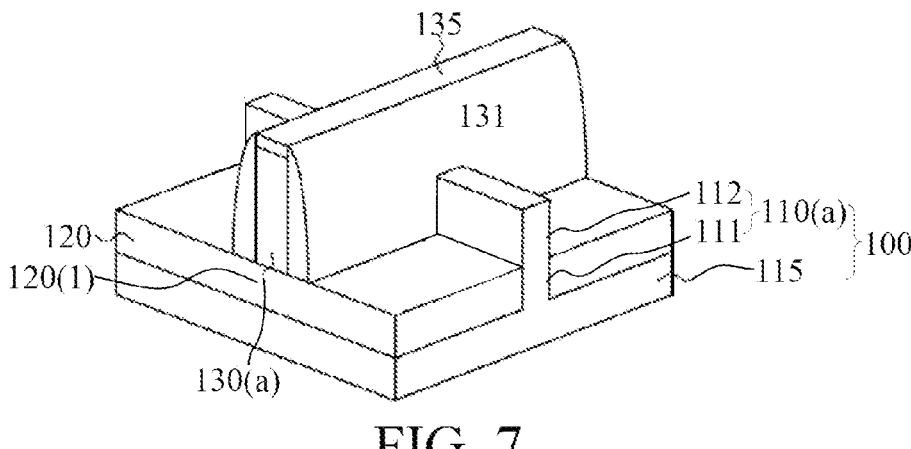

With reference to FIG. 7, after the gate structure 130 is formed, the method for forming a semiconductor structure further includes: forming a gate spacer 140 on a sidewall of the gate structure 130.

The gate spacer 140 is configured to protect the sidewall of the gate structure 130. The gate spacer 140 is further configured to define a position for subsequently forming the source/drain doped layer.

The gate spacer 140 may be made of one or more of silicon oxide, silicon nitride, silicon oxynitride, silicon carbide, silicon oxycarbide or silicon oxycarbonitride, boron nitride, and carbon boron nitride. The gate spacer 140 may be a single-layer structure or a laminated-layer structure. In some implementations, the gate spacer 140 is a single-layer structure, and the gate spacer 140 is made of silicon nitride.

In some implementations, the gate spacer 140 further covers a sidewall of the gate mask layer 135.

Figure 8:
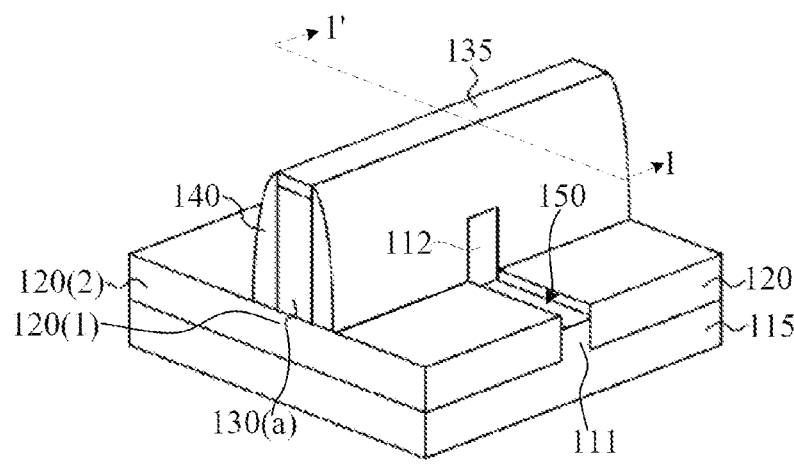
Figure 9:
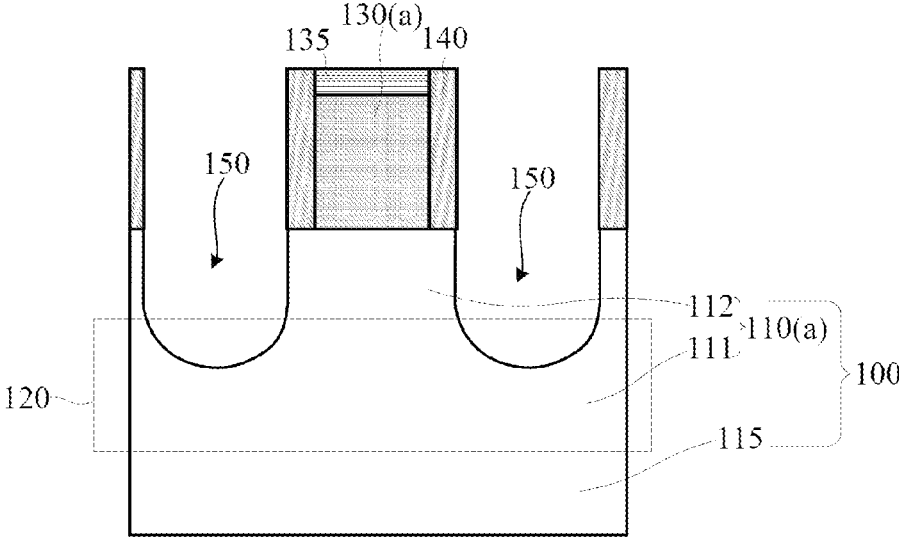

Referring to FIG. 8 to FIG. 9, FIG. 8 is a three-dimensional schematic view, and FIG. 9 is a cross-sectional view of FIG. 8 in a direction 1-1', where source/drain grooves 150 are formed in the channel structure 110 on two sides of the gate structure 130.

The source/drain grooves 150 are configured to provide a space for forming the source/drain doped layer.

In some implementations, the source/drain grooves 150 are further located in part of the protrusions 111 on the two sides of the gate structure 130. Therefore, top surfaces of the source/drain grooves 150 are relatively low. In this way, after a sacrificial epitaxial layer is subsequently formed at a bottom of each source/drain groove 150, there is still sufficient space in the source/drain groove 150 for forming the source/drain doped layer. In addition, the volume of the source/drain doped layer formed in the source/drain groove 150 can meet the process requirements, and correspondingly, the stress requirements for the source/drain doped layer are also met.

Correspondingly, in some implementations, bottom surfaces of the source/drain grooves 150 are lower than a top surface of the isolation layer 120.

In other implementations, the bottom surfaces of the source/drain grooves may also be flush with the top surface of the isolation layer according to actual process requirements.

In some implementations, the source/drain grooves 150 are formed by using the following step: etching the channel structure 112 on the two sides of the gate structure 130 by a dry etching process to form the source/drain grooves 150. The dry etching process has high etching accuracy and desirable process controllability. The dry etching process helps ensure the quality of the cross-sectional topography of the source/drain grooves 150 and helps ensure that the depths of the source/drain grooves 150 meet the process requirements.

For ease of illustration and description, in the cross-sectional view, a dashed-line box 120 is used to indicate a position and a thickness of the isolation layer 120 in a direction perpendicular to the substrate 115.

Figure 10:
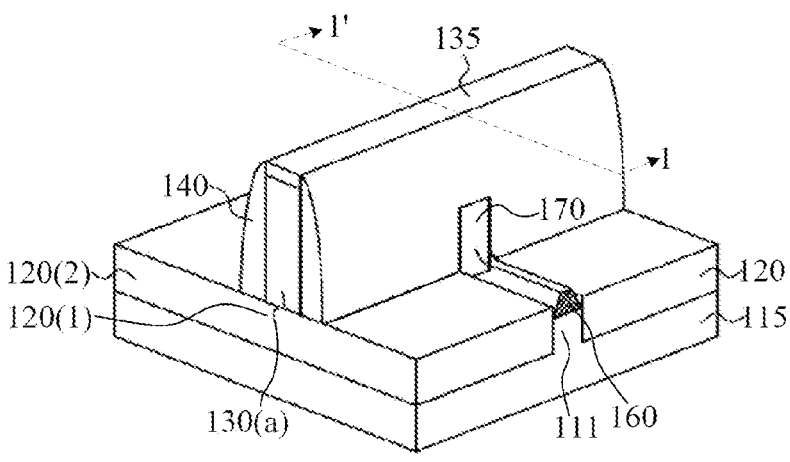
Figure 11:
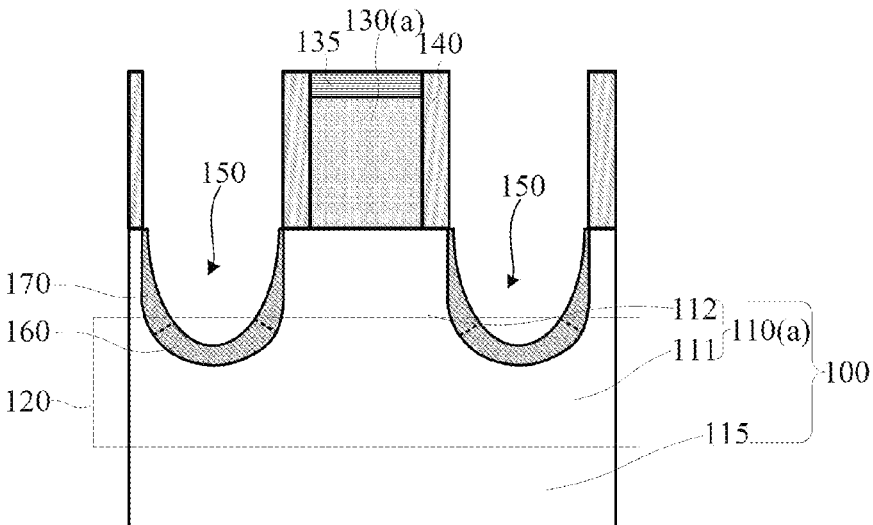

Referring to FIG. 10 to FIG. 11, FIG. 10 is a three-dimensional schematic view, and FIG. 11 is a cross-sectional view of FIG. 10 in a direction 1-1', where a sacrificial epitaxial layer 160 is formed on the bottom of the source/drain groove 150.

After the source/drain grooves 150 are formed and before the source/drain doped layers are formed in the source/drain grooves 150, a sacrificial epitaxial layer 160 is further formed at a bottom of each source/drain groove 150. Correspondingly, in the step of forming the source/drain doped layer, the source/drain doped layer is located on the sacrificial epitaxial layer 160, the source/drain doped layer is usually formed by using an epitaxy process, and the sacrificial epitaxial layer 160 is made of an epitaxial layer material. After the sacrificial epitaxial layer 160 is formed at the bottom of the source/drain groove 150, the source/drain doped layer located in the source/drain groove 150 may be correspondingly formed on the sacrificial epitaxial layer 160 by using the epitaxy process on the basis of the sacrificial epitaxial layer 160. Therefore, the epitaxy process for forming the source/drain doped layer is prevented from adverse effects, the epitaxial growth quality of the source/drain doped layer is ensured, and the performance of the semiconductor structure is optimized.

Moreover, after the source/drain doped layer is formed, the sacrificial epitaxial layer 160 is further removed, to form a gap between the bottom of the source/drain doped layer and the protrusion 111. By means of the gap, the isolation between the source/drain doped layer and the protrusion 111 below the source/drain doped layer is achieved, facilitating prevention of a parasitic device in the protrusion 111 below the source/drain doped layer. In this way, the leakage current of the semiconductor structure is reduced.

The sacrificial epitaxial layer 160 has an etching selectivity to the protruding structure 110 and to the subsequently formed source/drain doped layer, so that the sacrificial epitaxial layer 160 is subsequently removed. Therefore, during subsequent removal of the sacrificial epitaxial layer 160, etching rates of the protruding structure 110, the channel structure 112, and the source/drain doped layer are low, reducing the probability of damage to the protruding structure 110, the channel structure 112, and the source/drain doped layer.

The sacrificial epitaxial layer 160 is a made of a semiconductor material. Therefore, the sacrificial epitaxial layer 160 can be used as a growth basis of the epitaxy process for subsequently forming the source/drain doped layer.

For example, a material of the sacrificial epitaxial layer 160 includes one or more of silicon, silicon phosphide, silicon germanium, silicon carbide, germanium, gallium nitride, gallium arsenide, and indium gallium. In some implementations, the protruding structure 110 is a fin 110(*a*), the fin 110(*a*) is made of silicon, and the sacrificial epitaxial layer 160 is made of silicon germanium, silicon germanium and silicon have an etching selectivity. Therefore, the sacrificial epitaxial layer 160 and the protruding structure 110 are likely to have a relatively high etching selectivity.

It should be noted, during formation of the sacrificial epitaxial layer 160, the thickness of the sacrificial epitaxial layer 160 is required to be neither excessively small nor excessively large. If the thickness of the sacrificial epitaxial layer 160 is excessively small, the size of the gap formed between the bottom of the source/drain doped layer and the protrusion 111 after the sacrificial epitaxial layer 160 is removed is excessively small, and the distance between the bottom of the source/drain doped layer and the protrusion 111 below the source/drain doped layer is also excessively small. Therefore, the leakage current reduction effect of the gap easily degrades. In addition, the excessively thin sacrificial epitaxial layer 160 easily increases the difficulty of the subsequent removal of the sacrificial epitaxial layer 160. If the thickness of the sacrificial epitaxial layer 160 is excessively large, an excessively large space in the source/drain groove 150 is occupied, resulting in an excessively small remaining space in the source/drain groove 150 for forming the source/drain doped layer.

In some implementations, in the step of forming the sacrificial epitaxial layer 160, a top surface of the sacrificial epitaxial layer 160 is flush with or lower than a top surface of the isolation layer 120. The top surface of the sacrificial epitaxial layer 160 being lower than or flush with the top surface of the isolation layer 120 means that the sacrificial epitaxial layer 160 is buried in the isolation layer 120, and the top surface of the sacrificial epitaxial layer 160 is lower. Therefore, a sufficient remaining space is provided for subsequently forming the source/drain doped layer in the source/drain groove 150, ensuring that the volume of the source/drain doped layer can meet the process requirements, thereby ensuring that the stress in the source/drain doped layer meets the process requirements.

In other implementations, the top surface of the sacrificial epitaxial layer may be higher than the top surface of the isolation layer based on actual process requirements.

More specifically, for example, a thickness of the sacrificial epitaxial layer 160 is in a range of 5 nm to 10 nm. For example, the thickness of the sacrificial epitaxial layer is 6 nm, 7 nm, 7.5 nm, 8 nm, or 9 nm.

In some implementations, the sacrificial epitaxial layer 160 is formed by using an epitaxy process. By means of the epitaxy process, epitaxial growth can be selectively performed on the protruding structure 110 exposed from the source/drain groove 150, to form the epitaxial material layer, but not on the insulating materials (for example, the gate spacer 140, the isolation layer 120, and the gate mask layer 135), thus eliminating the need to remove the epitaxial material layer located outside the desired area, correspondingly simplifying the process.

During the epitaxy process, epitaxial growth is performed on both of the sidewall and the bottom of the protruding structure 110 exposed from the source/drain groove 150 to form an epitaxial material layer. Therefore, the method for forming a semiconductor structure further includes: in the step of forming the sacrificial epitaxial layer 160, forming a sidewall epitaxial layer 170 on the channel structure 112 exposed from the sidewall of the source/drain groove 150 by using the epitaxy process.

Specifically, the epitaxial material layer on the channel structure 112 exposed from the bottom of the source/drain groove 150 is used as the sacrificial epitaxial layer 160, and the epitaxial material layer on the channel structure 112 exposed from the sidewall of the source/drain groove 150 is used as a sidewall epitaxial layer 170.

In some implementations, the sidewall epitaxial layer 170 is further configured to form the source/drain doped layer. Therefore, the sidewall epitaxial layer 170 is further doped with ions. When an NMOS transistor is to be formed, the sidewall epitaxial layer 170 is doped with N-type ions.

When a PMOS transistor is to be formed, the sidewall epitaxial layer 170 is doped with P-type ions.

In some implementations, the sidewall epitaxial layer 170 and the sacrificial epitaxial layer 160 are an integral structure.

In other implementations, the sidewall epitaxial layer and the sacrificial epitaxial layer may not be an integral structure. For example, when a GAA transistor is to be formed, the channel structure includes one or more spaced channel layers, and a place holding portion is further disposed between the channel layer and the protrusion and between adjacent channel layers. In the step of forming the sidewall epitaxial layer and the sacrificial epitaxial layer, the epitaxial material layers located on the bottom and the sidewall of the source/drain groove may be in contact with each other, or may not be in contact with other. When the epitaxial material layers on the bottom and the sidewall of the source/drain groove are not in contact with each other, that is, the sacrificial epitaxial layer and the sidewall epitaxial layer are not in contact with each other, the sacrificial epitaxial layer and the sidewall epitaxial layer are correspondingly not an integral structure.

Figure 12:
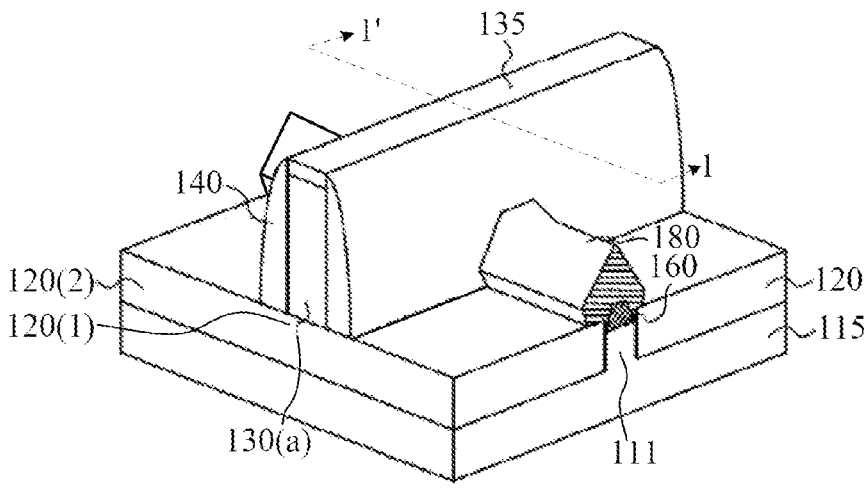
Figure 13:
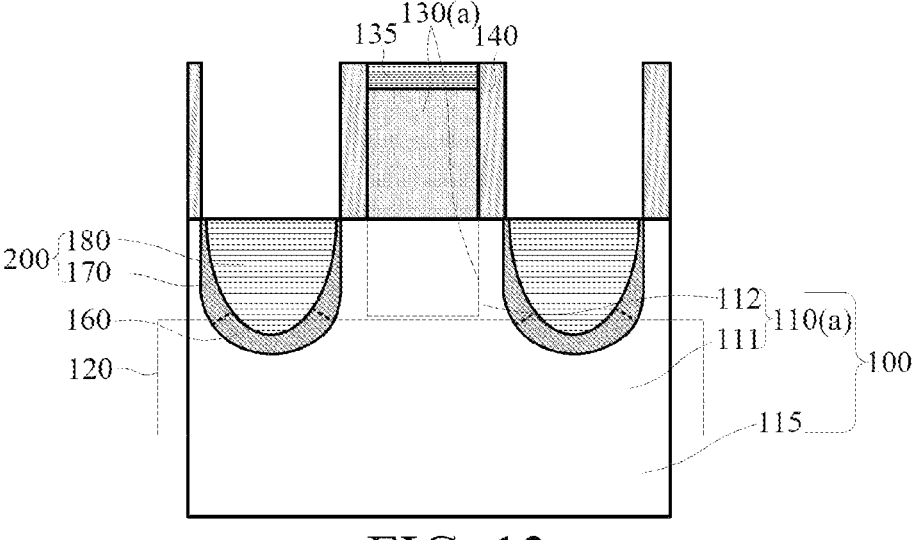

Referring to FIG. 12 to FIG. 13, FIG. 12 is a three-dimensional schematic view, and FIG. 13 is a cross-sectional view of FIG. 12 in a direction 1-1', where a source/drain doped layer 200 located in the source/drain groove 150 is formed on the sacrificial epitaxial layer 160.

The source/drain doped layer 200 is used as a source or a drain of the FET. During operation of the FET, the source/drain doped layer 200 is configured to provide a carrier source.

The source/drain doped layer 200 is located in the source/drain groove 150 and on the sacrificial epitaxial layer 160. Therefore, after the sacrificial epitaxial layer 160 is subsequently removed, a gap may be formed between the bottom of the source/drain doped layer 200 and the protrusion 111 to provide a spacing between the bottom of the source/drain doped layer 200 and the protrusion 111.

The source/drain doped layer 200 is usually formed by using an epitaxy process, and the sacrificial epitaxial layer 160 is made of an epitaxial layer material. After the sacrificial epitaxial layer 160 is formed at the bottom of the source/drain groove 150, the source/drain doped layer 200 located in the source/drain groove 150 may be correspondingly formed on the sacrificial epitaxial layer 160 by using the epitaxy process on the basis of the sacrificial epitaxial layer 160. Therefore, the epitaxy process for forming the source/drain doped layer 200 is prevented from adverse effects, the epitaxial growth quality of the source/drain doped layer 200 is ensured, and the performance of the semiconductor structure is optimized.

In some implementations, the source/drain doped layer 200 is formed by using the following step: forming a source/drain epitaxial layer 180 on the sidewall epitaxial layer 170 and the sacrificial epitaxial layer 160, where the source/drain epitaxial layer 180 and the sidewall epitaxial layer 170 are configured to form the source/drain doped layer 200. The source/drain epitaxial layer 180 covers the sidewall of the sidewall epitaxial layer 170. Therefore, the source/drain doped layer 200 is in contact with an end of the channel structure 112 that is in an extending direction.

In some implementations, the source/drain epitaxial layer 180 and the sidewall epitaxial layer 170 are configured to constitute a stress layer. Therefore, during operation of the FET, a stress can be provided to a channel region, thereby improving the carrier mobility.

In some implementations, the source/drain epitaxial layer 180 is doped with ions. When a PMOS transistor is to be formed, the source/drain epitaxial layer 180 is doped with P-type ions, and the source/drain epitaxial layer 180 is made of Si or SiGe. When a PMOS transistor is to be formed, the source/drain epitaxial layer 180 includes a stress layer doped with N-type ions, and the source/drain epitaxial layer 180 is made of Si or SiC.

In some implementations, the source/drain epitaxial layer 180 is formed by using the epitaxy process on the basis of the sacrificial epitaxial layer 160 and the sidewall epitaxial layer 170, and during formation of the source/drain epitaxial layer 180, ions are self-doped in situ.

Correspondingly, in the step of forming the source/drain doped layer 200, the source/drain doped layer 200 covers an exposed surface of the sacrificial epitaxial layer 160.

Figure 14:
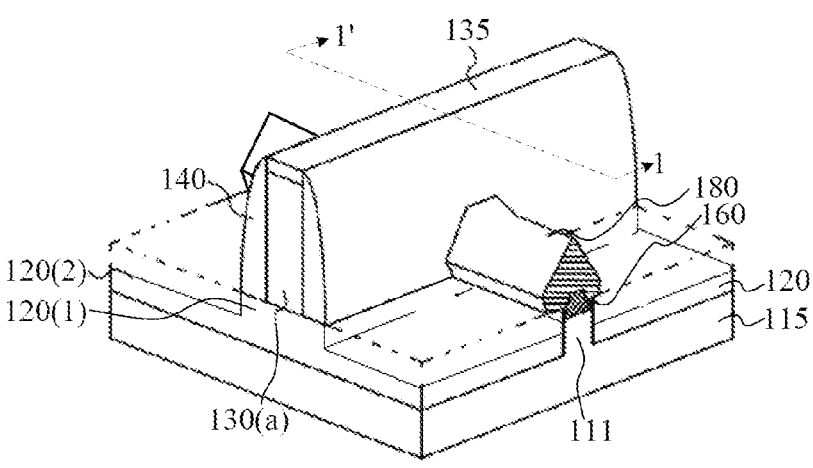
Figure 15:
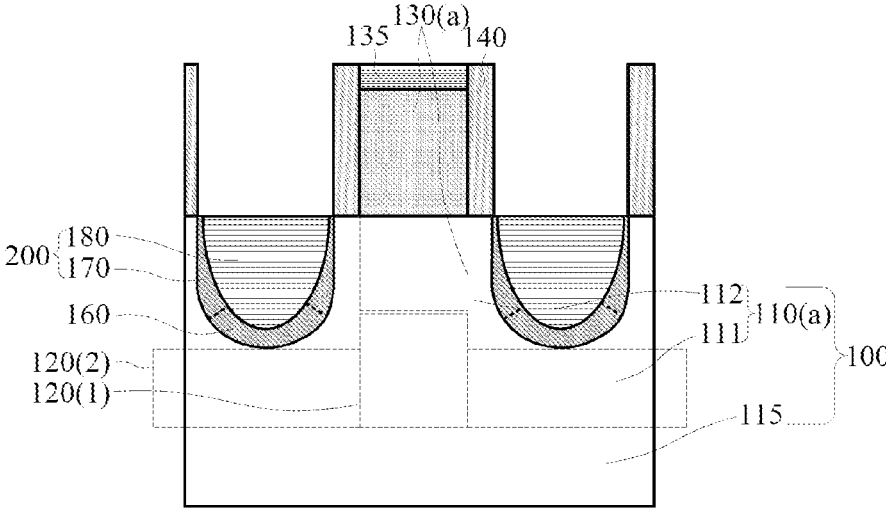
Figure 16:
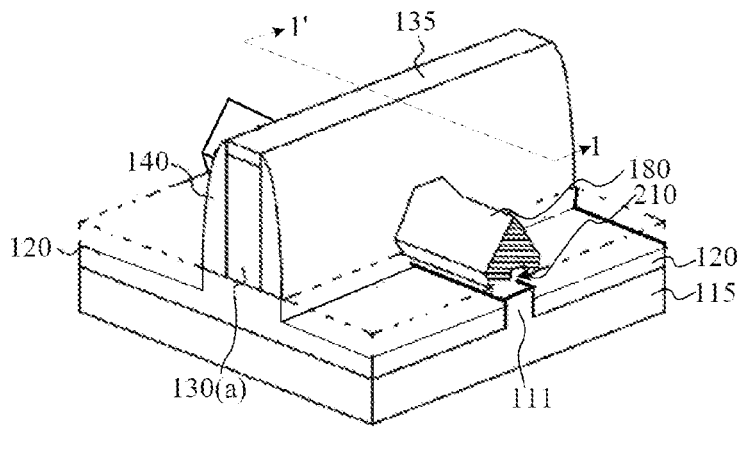
Figure 17:
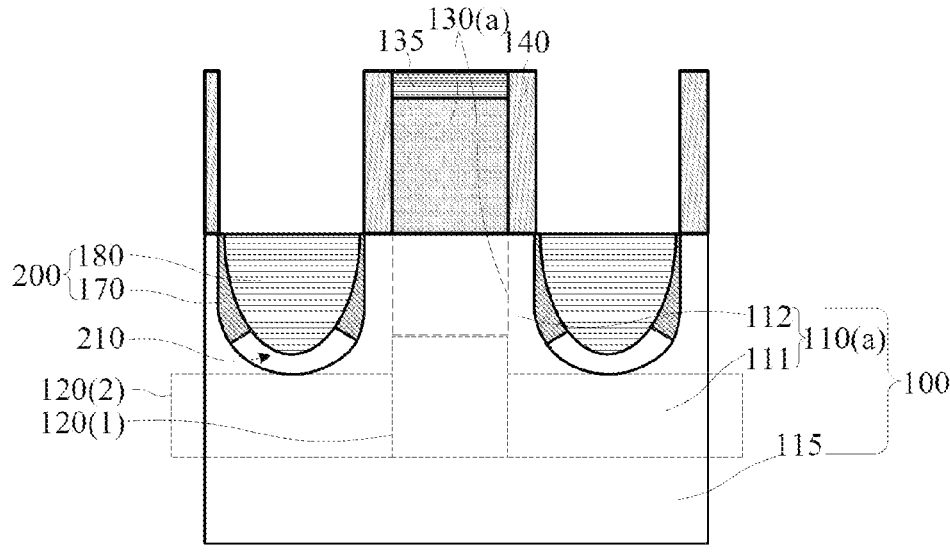

Referring to FIG. 14 to FIG. 17, FIG. 14 is a three-dimensional schematic view, FIG. 15 is a cross-sectional view along a direction 1-1' in FIG. 14, FIG. 16 is a three-dimensional schematic view, and FIG. 17 is a cross-sectional view along a direction 1-1' in FIG. 16, where the sacrificial epitaxial layer 160 is removed to form a gap 210 between the bottom of the source/drain doped layer 200 and the protrusion 111.

The sacrificial epitaxial layer 160 is removed to form a gap 210 between the bottom of the source/drain doped layer 200 and the protrusion 111. By means of the gap, the isolation between the source/drain doped layer 200 and the protrusion 111 below the source/drain doped layer is achieved, facilitating prevention of a parasitic device in the protrusion 111 below the source/drain doped layer 200. In this way, the leakage current of the semiconductor structure is reduced, and the performance of the semiconductor structure is optimized.

It should be noted that, in some implementations, in the step of forming the source/drain doped layer 200, the source/drain doped layer 200 covers the exposed surface of the sacrificial epitaxial layer 160. Therefore, the step of removing the sacrificial epitaxial layer 160 includes: after the source/drain doped layer 200 is formed, removing, in thickness, a part of the isolation layer 120 exposed from the gate structure 130, to expose a part of a sidewall of the sacrificial epitaxial layer 160; and removing the sacrificial epitaxial layer 160 by using the exposed sidewall of the sacrificial epitaxial layer 160.

By removing, in thickness, a part of the isolation layer 120 exposed from the gate structure 130, the sacrificial epitaxial layer 160 is exposed, thereby removing the sacrificial epitaxial layer 160.

Specifically, a part of the isolation layer 120 exposed from the gate structure 130 may be removed in thickness by one or both of dry etching and wet etching.

In some implementations, after removing, in thickness, a part of the isolation layer 120 exposed from the gate structure 130, the isolation layer 120 includes a first isolation layer 120(1) located below the gate structure 130 and a second isolation layer 120(2) located at a side of the gate structure 130. A top surface of the second isolation layer 120(2) is lower than a top surface of the first isolation layer 120(1).

In some implementations, the sacrificial epitaxial layer 160 is removed by using an isotropic etching process. The isotropic etching process has an isotropic etching characteristic. Therefore, the sacrificial epitaxial layer 160 between the source/drain doped layer 120 and the protrusion 111 can be completely removed by using the exposed sidewall of the sacrificial epitaxial layer 160.

During the removal of the sacrificial epitaxial layer 160, the sidewall epitaxial layer 170 as a result of being covered by the source/drain epitaxial layer 180.

In some implementations, the gap 210 is formed by removing the sacrificial epitaxial layer 160. In a direction perpendicular to a bottom wall of the source/drain doped layer 200, a height of the gap 210 is in a range of 5 nm to 10 nm based on the thickness of the sacrificial epitaxial layer 160.

Figure 18:
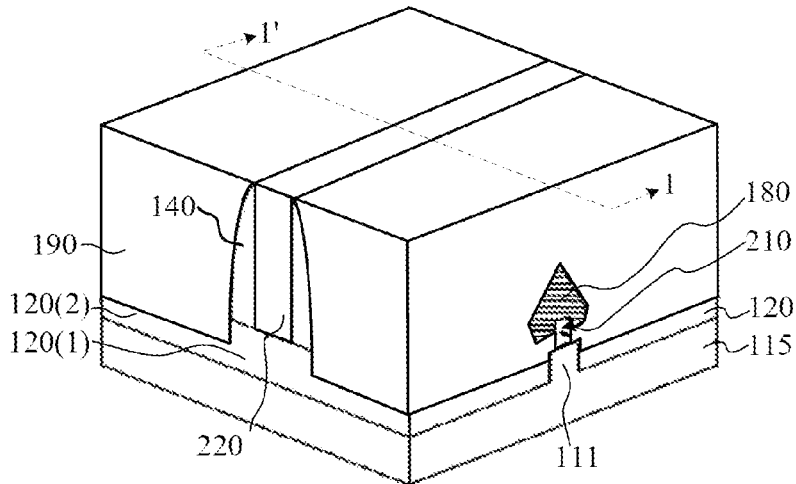
Figure 19:
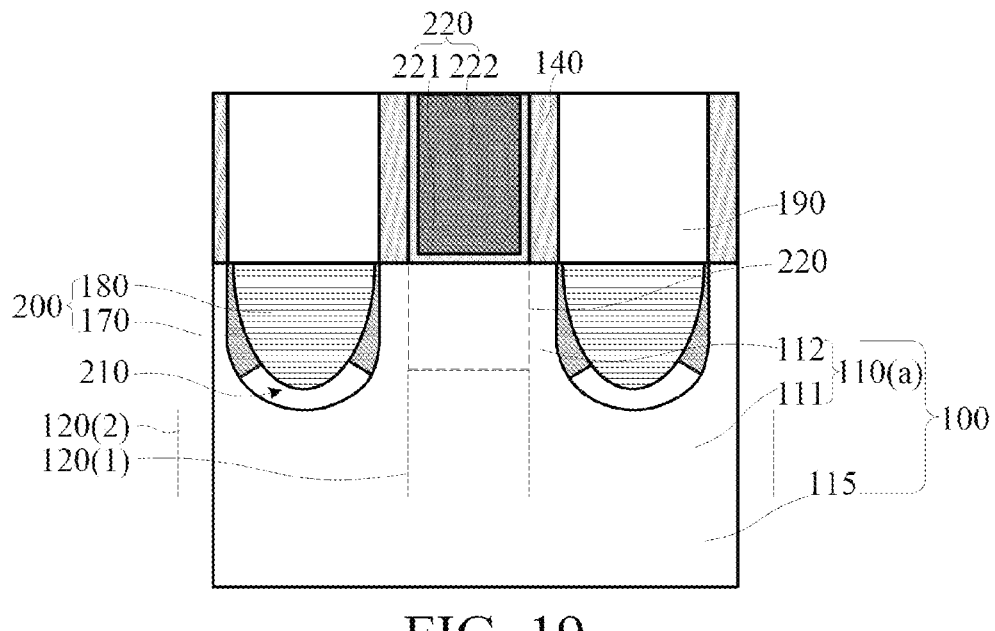

Referring to FIG. 18 to FIG. 19, in some implementations, the method for forming a semiconductor structure further includes: after the sacrificial epitaxial layer 160 is removed, forming an interlayer dielectric layer 190 on the isolation layer 120 exposed from the gate structure 130, where the interlayer dielectric layer 190 covers the source/drain doped layer 200 and fills a part or an entirety of the gap 210.

The interlayer dielectric layer 190 is configured to isolate adjacent devices from each other. In some implementations, the interlayer dielectric layer 190 is made of silicon oxide. The interlayer dielectric layer 190 may also be made of other insulating materials.

During specific implementation, the interlayer dielectric layer 190 may include an etching stop layer (not shown) conformally covering a sidewall of the gate spacer 135 and a surface of the source/drain doped layer 200 and a dielectric material layer (not shown) located on the etching stop layer. The etching stop layer or the dielectric material layer fills a part or an entirety of the gap 210.

The etching stop layer is configured to temporarily define an etching stop position in a subsequent etching process for forming a source/drain contact hole, to prevent the source/drain doped layer 200 from being damaged in the etching process for the source/drain contact hole.

For example, the etching stop layer is made of silicon nitride.

In some other implementations, the interlayer dielectric layer may not include the etching stop layer.

It should be noted that, in some implementations, in the step of forming the interlayer dielectric layer 190, the gate mask layer 135 is further removed, thereby exposing the top of the gate structure 130 for subsequent removing the gate structure 130.

Still referring to FIG. 18 and FIG. 19, in some implementations, the protruding structure 110 is a fin 110(a), and the gate structure 130 is a dummy gate structure 130(a). The method for forming a semiconductor structure further includes: after the source/drain doped layer 200 is formed, removing the dummy gate structure 130(a) to form a gate opening (not shown in the figure), and forming a device gate structure 220 in the gate opening.

The gate opening is configured to provide a space for forming the device gate structure.

In some implementations, the gate opening spans the fin, and the gate opening is located in the interlayer dielectric layer 190.

The device gate structure 220 is configured to control the conductive channel to open and close. In some implementations, the device gate structure 220 spans the fin 110(a) and covers a part of a top and a part of a sidewall of the fin 110(a).

The device gate structure 220 includes a gate dielectric layer 221 and a gate layer 222 located on the gate dielectric layer 221.

The gate dielectric layer 211 is configured to implement electrical isolation between the gate layer 222 and the channel.

A material of the gate dielectric layer 211 includes one or more of silicon oxide, nitrogen-doped silicon oxide, $HfO_2$, $ZrO_2$, HfSiO, HfSiON, HfTaO, HfTiO, HfZrO, $La_2O_3$, and $Al_2O_3$.

The gate layer 222 is used as an external electrode for electrically connecting the gate structure 220 to an external circuit.

In some implementations, the device gate structure 220 is a metal gate structure.

Correspondingly, the gate dielectric layer 211 includes a high-k gate dielectric layer, and the gate layer 222 is a metal gate layer. In some implementations, a material of the gate layer 222 includes one or more of TiN, TaN, Ti, Ta, TiAL, TiALC, TiSiN, W, Co, Al, Cu, Ag, Au, Pt, and Ni.

In some implementations, for ease of illustration and description, a position of a bottom of the device gate structure 220 is indicated by a dashed-line box in the cross-sectional view.

In other implementations, the channel structure includes one or more channel layers spaced apart and suspended on the protrusion, and a place holding portion is formed between the channel layer and the protrusion and between adjacent channel layers. In some implementations. The method for forming a semiconductor structure further includes: after the source/drain doped layer is formed, removing the dummy gate structure to form a gate opening; removing the place holding portion through the gate opening, and forming a through groove between the protrusion and the channel layer or between the adjacent channel layers, where the through groove communicates with the channel layer; and forming a device gate structure in the gate opening and the through groove, where the device gate structure surrounds the channel layer.

Although the present disclosure is described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
a base, comprising a substrate and a plurality of protruding structures separately disposed on the substrate, wherein each protruding structure of the plurality of protruding structures comprises a protrusion and a channel structure located on the protrusion;
an isolation layer, located on the substrate and surrounding the protrusion on each protruding structure of the plurality of protruding structures, wherein a top surface of the isolation layer is lower than a top surface of the protruding structures of the plurality of protruding structures;
a device gate structure, located on the isolation layer and spanning the channel structure of the protruding structures of the plurality of protruding structures; and
source/drain doped layers, located in the channel structure of the protruding structures of the plurality of protruding structures on two sides of the device gate structure, wherein a gap is formed between a bottom of each source/drain doped layer and the protrusion, the gap is defined by at least a bottom surface of the source/drain doped layer and a top surface of the protrusion.

2. The semiconductor structure according to claim 1, further comprising:
an interlayer dielectric layer, located on the isolation layer exposed from the device gate structure, wherein the interlayer dielectric layer covers the source/drain doped layer, and fills at least part of the gap.

3. The semiconductor structure according to claim 1, wherein the isolation layer comprises a first isolation layer located below the device gate structure and a second isolation layer located at a side of the device gate structure, and a top surface of the second isolation layer is lower than a top surface of the first isolation layer.

4. The semiconductor structure according to claim 1, wherein the source/drain doped layers comprises a sidewall epitaxial layer, in contact with a sidewall of the channel structure of the protruding structures of the plurality of protruding structures below the device gate structure and a source/drain epitaxial layer, located on a sidewall of the sidewall epitaxial layer.

5. The semiconductor structure according to claim 4, wherein a material of the sidewall epitaxial layer comprises at least one of silicon, silicon phosphide, silicon germanium, silicon carbide, germanium, gallium nitride, gallium arsenide, or indium gallium.

6. The semiconductor structure according to claim 1, wherein in a direction perpendicular to a bottom wall of the source/drain doped layer, a height of the gap is in a range of 5 nm to 10 nm.

7. The semiconductor structure according to claim 1, wherein:

a material of the substrate comprises at least one of monocrystalline silicon, germanium, silicon germanium, silicon carbide, gallium nitride, gallium arsenide, or indium gallium;

a material of the protrusion comprises at least one of monocrystalline silicon, germanium, silicon germanium, silicon carbide, gallium nitride, gallium arsenide, or indium gallium; and a material of the channel structure comprises at least one of monocrystalline silicon, germanium, silicon germanium, silicon carbide, gallium nitride, gallium arsenide, or indium gallium.

8. The semiconductor structure according to claim 1, wherein:

the protruding structure is a fin, and the protrusion and the channel structure are an integral structure; or the channel structure comprises one or more channel layers spaced apart and suspended on the protrusion, and the device gate structure surrounds the channel layers.

9. The semiconductor structure according to claim 1, wherein the device gate structure comprises a gate dielectric layer and a gate layer located on the gate dielectric layer.

10. The semiconductor structure according to claim 9, wherein a material of the gate dielectric layer comprises:

at least one of silicon oxide, nitrogen-doped silicon oxide, $HfO_2$, $ZrO_2$, HfSiO, HfSiON, HfTaO, HfTiO, HfZrO, $La_2O_3$, or $Al_2O_3$; and a material of the gate layer comprises at least one of TiN, TaN, Ti, Ta, TiAL, TiALC, TiSiN, W, Co, Al, Cu, Ag, Au, Pt, or Ni.

* * * * *